United States Patent
You et al.

(10) Patent No.: US 6,249,453 B1
(45) Date of Patent: Jun. 19, 2001

(54) VOLTAGE CONTROLLED SPINTRONIC DEVICES FOR LOGIC APPLICATIONS

(75) Inventors: Chun-Yeol You, Naperville; Samuel D. Bader, Oak Park, both of IL (US)

(73) Assignee: The University of Chicago, Chicago, IL (US)

(*) Notice: Subject to any disclaimer, the term of this patent is extended or adjusted under 35 U.S.C. 154(b) by 0 days.

(21) Appl. No.: 09/550,835

(22) Filed: Apr. 18, 2000

(51) Int. Cl.[7] .................................................. G11C 11/14
(52) U.S. Cl. .......................... 365/171; 365/173; 257/421
(58) Field of Search .................................... 365/158, 171, 365/173, 174; 257/421, 422, 427

(56) References Cited

U.S. PATENT DOCUMENTS

| | | | |
|---|---|---|---|
| 5,629,549 | * | 5/1997 | Johnson .................................. 257/421 |
| 5,654,566 | * | 8/1997 | Johnson .................................. 257/295 |
| 5,768,181 | * | 6/1998 | Zhu et al. ............................... 365/158 |
| 5,926,414 | * | 7/1999 | McDowell et al. ................... 365/173 |
| 6,069,820 | * | 5/2000 | Inomata et al. ....................... 365/171 |

* cited by examiner

Primary Examiner—Son T. Dinh
(74) Attorney, Agent, or Firm—Michael D. Rechtin; Foley & Lardner

(57) ABSTRACT

A reprogrammable logic gate comprising first and second voltage-controlled rotation transistors. Each transistor comprises three ferromagnetic layers with a spacer and insulating layer between the first and second ferromagnetic layers and an additional insulating layer between the second and third ferromagnetic layers. The third ferromagnetic layer of each transistor is connected to each other, and a constant external voltage source is applied to the second ferromagnetic layer of the first transistor. As input voltages are applied to the first ferromagnetic layer of each transistor, the relative directions of magnetization of the ferromagnetic layers and the magnitude of the external voltage determines the output voltage of the gate. By altering these parameters, the logic gate is capable of behaving as AND, OR, NAND, or NOR gates.

20 Claims, 3 Drawing Sheets

VOLTAGE CONTROLLED SPINTRONIC DEVICES FOR LOGIC APPLICATIONS

This invention was made with government support under Contract No. W-31-109-ENG-38 awarded to the Department of Energy. The Government has certain rights in this invention.

FIELD OF THE INVENTION

This invention relates generally to voltage controlled devices for logic applications. More particularly, this invention relates to voltage controlled rotation devices coupled to tunneling magneto-resistance devices.

BACKGROUND OF THE INVENTION

Logic gates incorporated into devices such as microprocessors are well known in the computer and electronics industries. Logic gates currently used in such projects have several characteristics, however, they cannot be reprogrammed to form a different type of logic gate. It is therefore desirable to construct a logic device that can be quickly reprogrammed to act as a different type of logic gate, and that would result in less power consumption and heat loss, is relatively simple to fabricate, and also would result in space and cost savings.

SUMMARY OF THE INVENTION

The term "spintronics" refers to a new generation of electronic devices that make use of the electron spin as well as its charge. It is anticipated that spintronics devices will have superior properties compared to their semiconductor counterparts based on reduced power consumption due their inherent nonvolatility, elimination of the initial booting-up of random access memory, rapid switching speed, ease of fabrication, and large number of carriers and good thermal conductivity of metals. Such devices include giant magnetoresistance (GMR) and tunneling magnetoresistance (TMR) structures that consist of ferromagnetic films separated by metallic or insulating layers, respectively. Switching of the magnetization direction of such elementary units is by means of an external magnetic field that is generated by current pulses in electrical leads that are in proximity.

A system whereby the magnetization direction is controlled by an applied voltage is discussed at length in U.S. Ser. No. 09/467,808, incorporated herein by reference. Such as system comprises a ferromagnetic device with first and second ferromagnetic layers. The ferromagnetic layers are disposed such that they combine to form an interlayer with exchange coupling. An insulating layer and a spacer layer are located between the ferromagnetic layers. When a direct bias voltage is applied to the interlayer with exchange coupling, the direction of magnetization of the second ferromagnetic layer will change. The structure of a voltage-controlled rotation (VCR) device represents a marriage of GMR and TMR in that the two ferromagnetic layers are separated by nanoscale layers of both a metallic spacer and an insulator. The behavior of the VCR structure was described in U.S. Ser. No. 09/467,808 based on a free-electron-like, one-dimensional approximation. The principle of operation is that a bias voltage modulates the spin-dependent reflectivities such that the magnetization direction of the two ferromagnetic layers can be rotated from parallel to anti-parallel alignment. With such a device element there are many possible applications, such as in magnetic sensors, microwave devices, optical switches, and logic devices.

There are several logic devices that are well-known in the art, but these have their drawbacks. In particular, it would be desirable if these logic devices could be reprogrammed in some way, so that each logic gate could be shifted from one type of device within the group of AND, OR, NAND, and NOR gates to a second part and become part of a new circuit.

It is therefore an object of this invention to provide a voltage-controlled rotation transistor for use in logic devices.

It is also an object of this invention to provide a method of constructing AND, OR, NAND, NOR and NOT gates using voltage-controlled rotation transistors.

It is yet another object of this invention to create a series of changeable logic gates wherein the character of a particular logic gate can change depending upon external controllable parameters.

It is yet another object of this invention to create a series of logic gates wherein the individual gates can be re-programmed by a user.

It is still another object of this invention to create a series of logic gates wherein the logic gates can be reprogrammed on nanosecond time scales.

The above referenced objects, advantages and features of the invention together with the organization and manner of operation thereof will become apparent from the following detailed description when taken into conjunction with the accompanying drawings wherein like elements have like numerals throughout the drawings described below.

DETAILED DESCRIPTION OF THE PREFERRED EMBODIMENTS

In order to illustrate various embodiments of the invention, the methodology and function are first described for the general concept behind the voltage-controlled rotation (VCR) element and then for applications to the VCR-transistor (VCRT) and corresponding logic devices. Although the manner in which the phenomena is described is one rigorous approach which explains the operation of the invention for those skilled in the art, other conventional mathematical and theoretical explanations can also be used to describe features which characterize various embodiments of the invention. The invention is therefore not limited to the description of its operation nor by the following mathematical explanations of operation.

Figure 1:
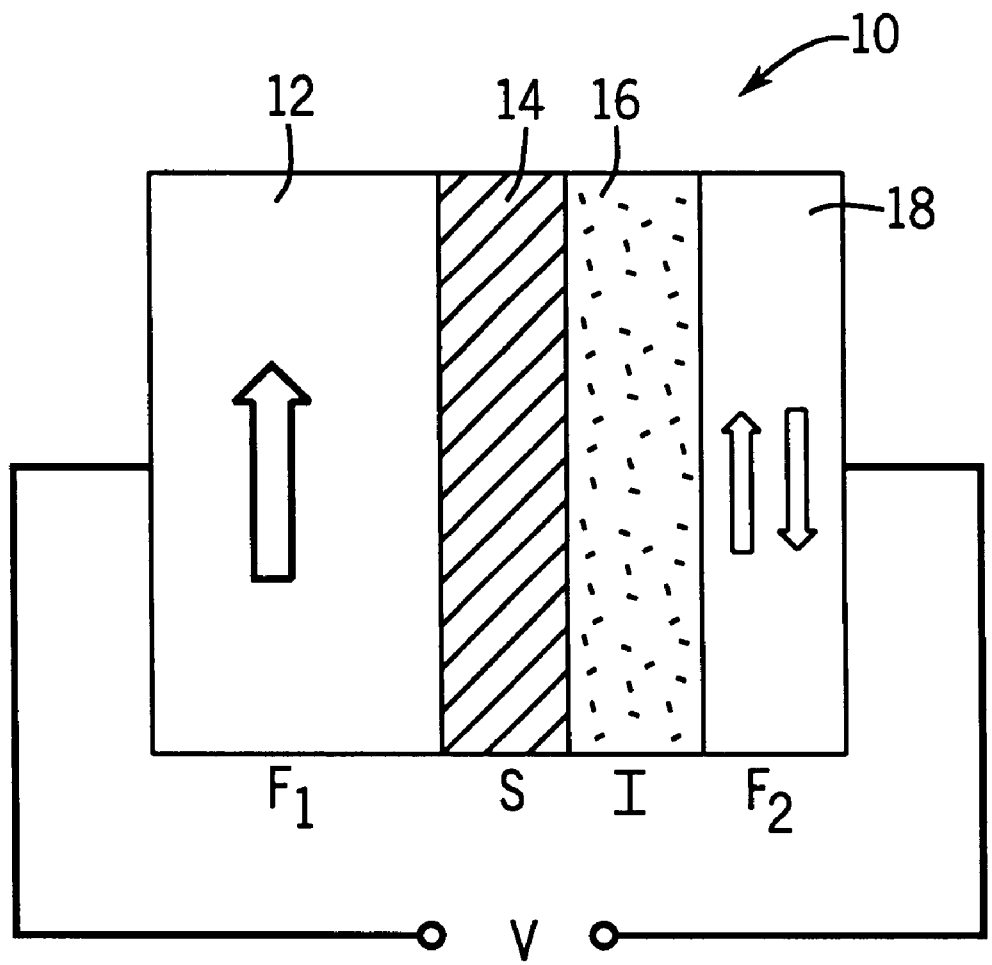
FIG. 1 is a schematic view of a voltage-controlled rotation (VCR) structure.

The VCR structure is shown generally at 10 in FIG. 1. A bias voltage has been applied to the VCR structure 10 and which modulates the spin-dependent reflectivity at the interface between a metallic spacer layer 14 and an insulating layer 16. Therefore, the exchange coupling energy between a harder ferromagnetic layer 12 and a softer ferromagnetic layer 18 is changed such that the magnetization of the softer ferromagnetic layer 18 can be rotated from parallel to anti-parallel to that of the harder (pinned) ferromagnetic layer 12. Importantly, this oscillation occurs in the absence of any magnetic field. This concept is described at length in the incorporated U.S. Ser. No. 09/467,808.

A variety of materials can be used for the harder ferromagnetic layer 12, the softer ferromagnetic layer 18, the spacer layer 14, and the insulating layer 16. Iron or cobalt is preferably used for the first ferromagnetic layer 12 while iron, cobalt or permalloy is preferably used for the second ferromagnetic layer 16. In the preferred embodiment of the invention, either chromium or copper can be used for the spacer layer 14. For the insulating layer 16, many narrow band gap semiconductors can also be used. For example, materials such as $SI_3N_4$, $Al_2O_3$, $SiO_2$, magnesium oxide, silicon, or germanium are particularly useful to achieve the desired result. It should be noted, however, that there are many other materials with similar properties as those mentioned above which can also be used to achieve the functionality of the invention.

Each of these layers can also have a variety of thicknesses. Preferably, the first ferromagnetic layer 12 will have a thickness of between about 40 and 100 Å, while the second ferromagnetic layer 18 has a thickness of between about 10 and 50 Å. Both the spacer layer 14 and the insulating layer 16 preferably have a thickness of about 10 Å. It is possible, however, for the thicknesses of the ferromagnetic layers 22 and 24, in addition to the spacer layer 14 and the insulating layer 16, which can have a thickness as great as about 500 Å.

The following energy equations can be used to describe the magnetization orientation of the two ferromagnetic layers 12 and 18:

$$E_{tot}=J_1(V)\cos(\theta_1-\theta_2)+K_1d_1\sin^2(\theta_1-\phi_1)+K_2d_2\sin^2(\theta_2-\phi_2)-HM_1d_1\cos(\theta_1-\Phi)-HM_2d_2\cos(\theta_2-\Phi). \quad (1)$$

In this equation, in-plane magnetization and an external magnetic field of zero are assumed. $J_1(V)$ is the interlayer exchange-coupling energy, which is a function of applied voltage V. The behavior of $J_1(V)$ is calculated within a free-electron-like, one-dimensional model. $K_i$ is a uniaxial magnetic anisotropy energy, $M_i$ is the magnitude of the magnetization, $d_i$ is the thickness, $\theta_i$ is the magnetization direction, and $\phi_i$ is the easy axis direction of the i-th layer (where i=1 or 2). H is the magnitude of the external magnetic field, and $\Phi$ specifies the direction of the external field. Conventionally in such energy equations, $J_1$ possesses a constant value for a given sample, and H is varied to solve the equation. However, in this case, it is assumed that H=0, and $J_1$ is a function of V. The inset of FIG. 2 uses the same parameters as those in U.S. Ser. No. 09/467,808. It is assumed that the harder ferromagnetic layer 12 is much thicker than the softer ferromagnetic layer 18 ($d_1$=500 Å and $d_2$=20 Å). In this case, it is assumed that $K_{1,2}=10^4$ J/m$^3$, and a plot of the magnetization direction of the thinner (softer) ferromagnetic layer 18 as a function of V in shown in FIG. 2.

Figure 2:
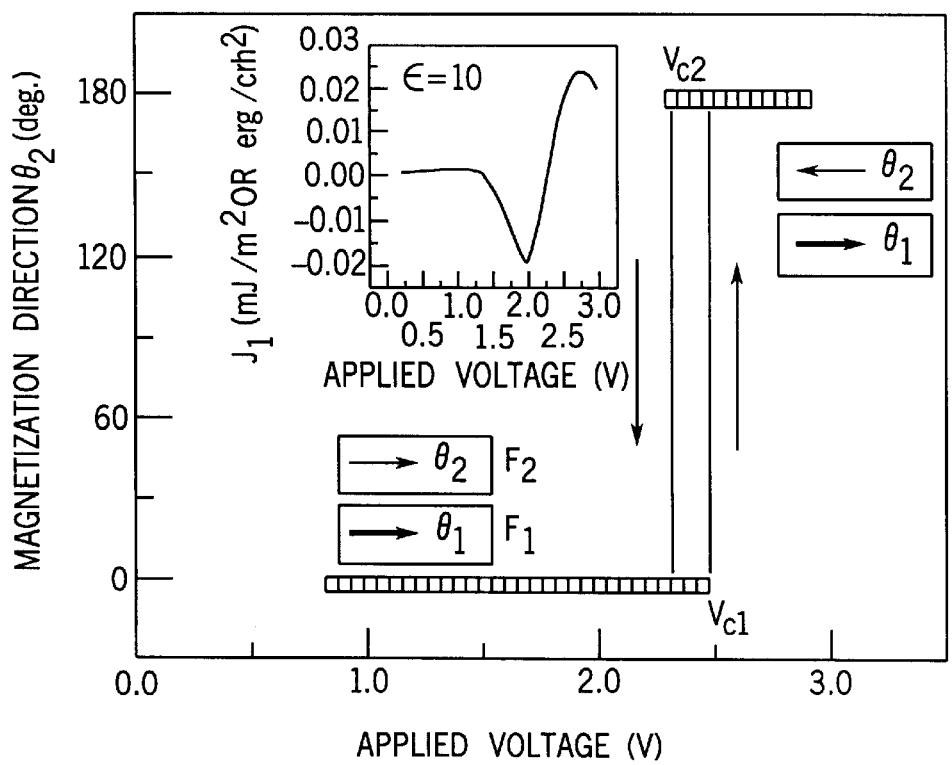
FIG. 2 is a plot showing the magnetization direction behavior as a function of applied bias voltage, wherein the inset shows the exchange coupling energy vs applied voltage with image force correction when the dielectric constant $\in=10$.

FIG. 2 shows that the magnetization direction of the thinner (softer) ferromagnetic layer 18 switches by applying a voltage. The voltage $V_{c1}$ and $V_{c2}$ are defined as 'coercive' voltages. It is important to note that the magnetization direction of the thicker (harder) ferromagnetic layer 12 does not change while the magnetization of the thinner (softer) ferromagnetic layer 18 is rotated. The detailed behavior of the relative magnetization orientations depends on the various parameters, such as the magnitude and types of magnetic anisotropies that are present, and the component layer thicknesses.

Figure 3:
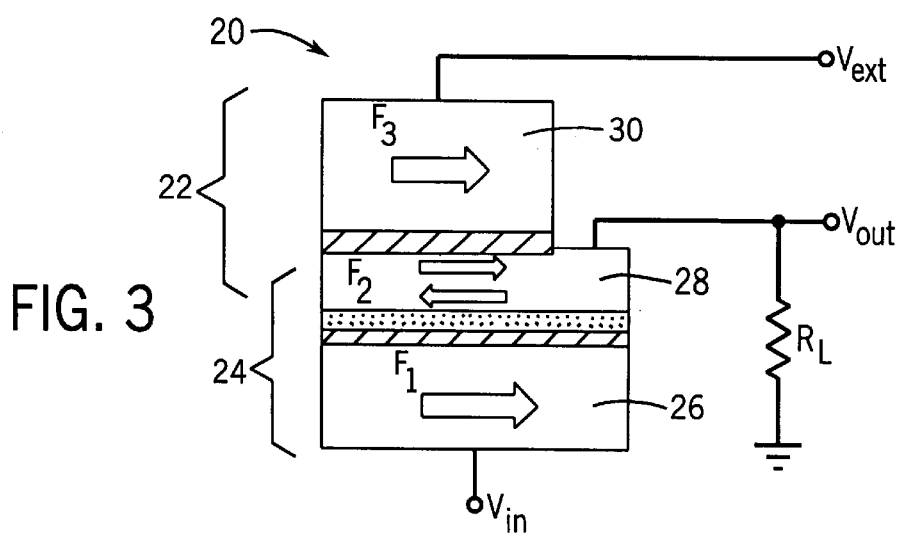
FIG. 3 is a schematic of the VCR-transistor (VCRT) configuration which includes VCR and TMR elements.

A VCR-transistor (VCRT), shown generally at 20 in FIG. 3 includes a TMR structure 22 and a VCR structure 24. The voltage $V_{ext}$ is the external fixed d.c. voltage source, $R_L$ is an external load resistance, and $V_{in}$ is the applied voltage for the VCR element 24. If $d_2<<d_1$ to make the second ferromagnetic layer 28 softer, then the magnetization direction of the second ferromagnetic layer 28 can be controlled by the applied voltage $V_{in}$ as outlined above. Furthermore, the resistance between the second ferromagnetic layer 28 and third ferromagnetic layer 30 that make up the TMR 22 depends on the relative magnetization directions of the two ferromagnetic layers 28 and 30. Therefore, if there is a constant voltage source $V_{ext}$, the voltage $V_{ext}-V_{out}$ between the second and third ferromagnetic layers 28 and 30 would vary as a function of $V_{in}$. It should also be noted that the voltage level of the second ferromagnetic layer 28 is $V_{out}$, not ground. Therefore, the $V_{in}$ of the VCRT 20 defines the voltage difference between the first ferromagnetic layer 26 and the second ferromagnetic layer 28. Since $V_{in}$ is ~1 V, and $V_{out}$ is ~100 mV, the change in $V_{out}$ is only ~5 mV for a typical case; thus, it is possible to ignore the effect of the change in $V_{out}$ on the magnitude of $V_{in}$.

In one orientation, it is assumed that $M_3$ is aligned parallel to $M_1$. In other words, it is assumed that the directions of magnetization of the first and third ferromagnetic layers 26 and 30 are parallel to each other. Then when $V_{in}<V_{c2}$ (see FIGS. 2–3), $M_2$ is also parallel to $M_3$ and, hence, the resistance R↑↑ is small. Increasing $V_{in}$ causes $M_2$ to align anti-parallel to $M_3$ when $V_{in}$ exceeds the coercive voltage $V_{c1}$. Then the resistance changes to R↑↓. When $V_{in}<V_{c2}$, the resistance returns to the value R↑↑. If the relative resistances are defined as $R_o$=R↑↑ and $\Delta R_o$=R↑↓–R↑↑=R☐↓–$R_O$, the output voltage can be obtained as follows:

$$V_{out} = V_{ext}R_L/(R_L+R_0) \equiv V_{out}^H$$

$$V_{in} \leq V_{c2}$$

$$V_{out} = V_{ext}R_L/(R_LR_0+\Delta R_0) \equiv V_{out}^L$$

$$V_{in} \geq V_{c1}$$

Figure 4:
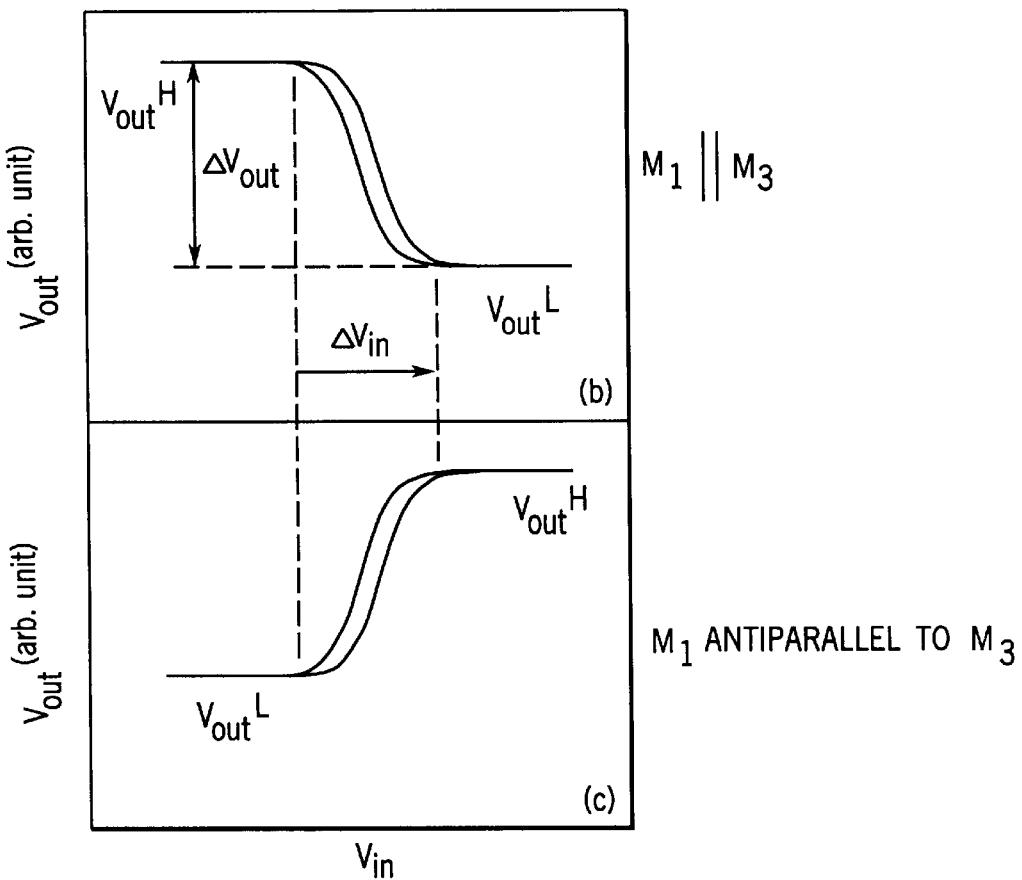
FIG. 4 is a plot showing the output voltage characteristic curve of the VCRT where $M_1$ is parallel to $M_3$ and where $M_1$ is antiparallel to $M_3$.

The output voltage dependence on input voltage is described in FIG. 4. Usually, while $\Delta V_{out}=V_{out}^H-V_{out}^L \approx V_{ext}R_L\Delta R_0/(R_L+R_0)^2$ is of order ~5 mV (when $R_L \approx R_0$~kΩ, $V_{ext}$~200 mV, and the TMR 22 is 10%), $\Delta V_{in}=V_{c1}-V_{c2}$ has a larger value (~100 mV). The value of $\Delta V_{in}$ is approximated from typical material parameters, but $\Delta V_{in}$ is a very sensitive function of the anisotropy, the thickness of the second ferromagnetic layer 28, and the voltage dependence of the exchange energy. Therefore, this device cannot amplify the voltage. However, the output voltage has highly nonlinear characteristics that are an essential part of the logic device. It should be noted that if initially $M_3$ is aligned anti-parallel to $M_1$, the output voltage characteristic curve is reversed, as shown in FIG. 4.

Figure 5:
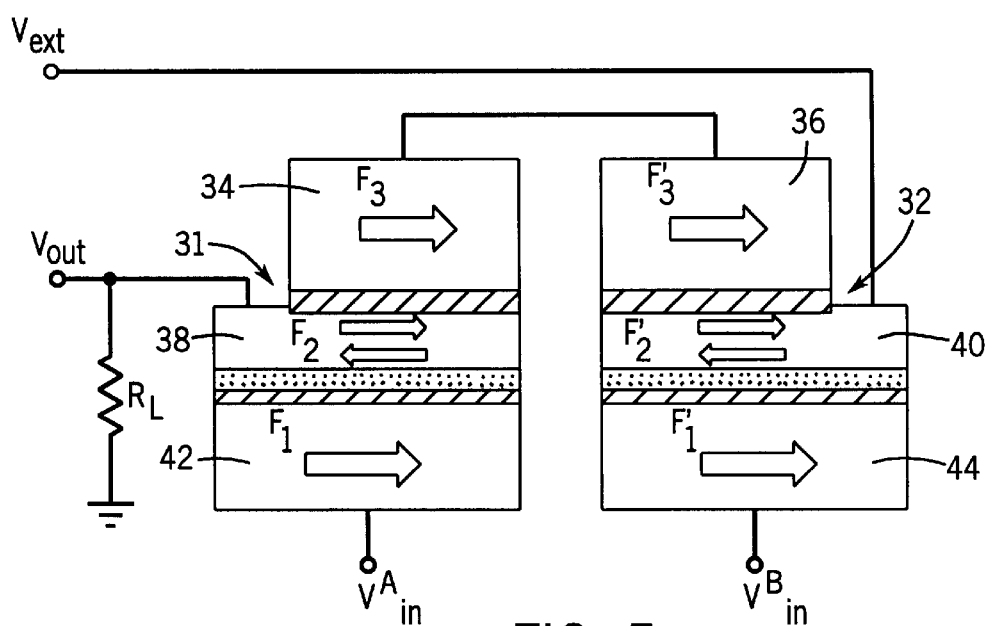
FIG. 5 is a schematic of a VCR logic device element.

Each logic gate consists of two identical VCRT 31 and 32 as shown in FIG. 5. There are input voltages $V_{in}^A$ and $V_{in}^B$ for the VCRT A 31 and the VCRT B 32, respectively, and the third ferromagnetic layer 34 in VCRT A 31 is connected to the third ferromagnetic layer 36 in VCRT B 32. The definition of $V^{inA}$ and $V_{in}^B$ is similar to that of the VCRT case of the previous section (the voltage difference between the first and second ferromagnetic layers 26 and 28, etc.). The external constant voltage source is applied between the second ferromagnetic layer 40 of VCRT B 32 and the ground through the second ferromagnetic layer 40 of VCRT B 32 and the load resistance $R_L$. As described in the previous section, the resistance between the second and third ferromagnetic layers 38 and 34 of VCRT A 31 (and for the corresponding components of VCRT B 32) depends on each input voltage and the initial magnetization direction of the third ferromagnetic layer 34 of VCRT A 31 and the third ferromagnetic layer 36 of VCRT B 32. First the case for which first and third ferromagnetic layers 42 and 34 in VCRT A 31 are parallel and the corresponding components in VCRT B 32 are parallel is considered. The various output voltages are as follows:

$$V_{out} = R_L V_{ext}/(R_L + 2R_0) \equiv V_1,$$

when $V_{in}^A = V_{in}^B < V_{c2}$, $$V_{out} = R_L V_{ext}/(R_L + 2R_0 + \Delta R_0) \equiv V_2,$$

when $V_{in}^A > V_{c1}$ and $V_{in}^B < V_{c2}$ or $V_{in}^B > V_{c1}$ and $V_{in}^A < V_{c2}$ $$V_{out} = R_L V_{ext}/(R_L + 2R_0 + 2\Delta R_0) \equiv V_3,$$

when $V_{in}^{A,B} > V_{c1}$.

This case assumes that $R_0^A = R_0^B = R_0$. In the case where the first and third ferromagnetic layers 42 and 34 in VCRT A 31 are antiparallel and the corresponding components in VCRT B 32 are antiparallel, the various output voltages are as follows:

$$V_{out} = R_L V_{ext}/(R_L + 2R_0) \equiv V_1$$

when $V_{in}^A = V_{in}^B > V_{c2}$, $$V_{out} = R_L V_{ext}/(R_L + 2R_0 + \Delta R_0) \equiv V_2$$

when $V_{in}^A > V_{c1}$ and $V_{in}^B < V_{c2}$ or $V_{in}^B > V_{c1}$ and $V_{in}^A < V_{c2}$ $$V_{out} = R_L V_{ext}/(R_L + 2R_0 + 2\Delta R_0) \equiv V_3$$

when $V_{in}^{A,B} < V_{c2}$

The characteristics of $V_{out}$ for various cases are summarized in Table 1, where the input-voltage state is defined for the case $V_{in}^{A,B} > V_{c1}$ as 'H', and that for $V_{in}^{A,B} < V_{c2}$ as 'L', and the output voltage states as '$H_{out}$' and '$L_{out}$' to indicate 'high' and 'low'.

Table 1 shows the logic gate behavior for NOR, NAND, AND, and OR gates for each case. To behave as a logic device, the output of one gate must be the input of the next gate. This can be achieved in two ways: one is to tune the material parameters to fit the requirement, and the other is to attach a buffer, such as a conventional field effect transistor. The most important advantage of this VCRT logic gate is that it is programmable. The same logic gate can be an NOR, NAND, AND, or OR gate depending on the external voltage $V_{ext}$ and the relative direction of $M_3$. If $M_3$ is replaced with another VCR structure, then the orientation of $M_3$ can be switched by application of another external voltage. Therefore, the VCR logic device has a re-programmability feature. A processor fabricated from such VCR logic devices could, in principle, be optimally configured for a given task, and then reprogrammed within nanoseconds to optimally perform a different kind of task. According to at least one approximation, it could take as few as ten nanoseconds to reprogram such a VCR logic device.

While preferred embodiments have been shown and described, it should be understood that changes and modifications can be made therein without departing from the invention in its broader aspects. Various features of the invention are defined in the following claims.

What is claimed is:

1. A logic device, comprising:
    a first voltage-controlled rotation transistor comprising three ferromagnetic layers, wherein a first spacer layer and a first insulating layer are located between the first and second ferromagnetic layers and wherein a second insulating layer is located between the second and third ferromagnetic layers;
    a second voltage-controlled rotation transistor comprising fourth, fifth, and sixth ferromagnetic layers, wherein a second spacer layer and a third insulating layer are located between the fourth and fifth ferromagnetic layers and wherein a fourth insulating layer is located between the fifth and sixth ferromagnetic layers;
    a first input voltage into the first ferromagnetic layer;
    a second input voltage into the second ferromagnetic layer; and
    an external voltage applied between the fifth ferromagnetic layer and the ground.

2. The logic device as defined in claim 1, wherein the second ferromagnetic layer has a direction of magnetization altered by a direct bias voltage, and the alteration arises from a source of voltage in the absence of a magnetic field.

TABLE 1

Behavior of $V_{out}$ for various cases ($V_1 > V_2 > V_3$). $V_{out}^{cri}$ is the criterion voltage. If $V_{out} > V_{out}^{cri}$, then the stge is $H_{out}$

| $M_3 \| M_1$ | | | | | | | | | | | |
|---|---|---|---|---|---|---|---|---|---|---|---|
| $V_2 < V_{out}^{cri}$ | | | $V_2 > V_{out}^{cri}$ | | | $V_2 < V_{out}^{cri}$ | | | $V_2 > V_{out}^{cri}$ | | |
| $V_{in}^A$ | $V_{in}^B$ | $V_{out}$ | $V_{in}^A$ | $V_{in}^B$ | $V_{out}$ | $V_{in}^A$ | $V_{in}^B$ | $V_{out}$ | $V_{in}^A$ | $V_{in}^B$ | $V_{out}$ |
| L | L | $H_{out}(=V_1)$ | L | L | $H_{out}(=V_1)$ | L | L | $L_{out}(=V_3)$ | L | L | $L_{out}(=V_3)$ |
| L | H | $L_{out}(=V_2)$ | L | H | $H_{out}(=V_2)$ | L | H | $L_{out}(=V_2)$ | L | H | $H_{out}(=V_2)$ |
| H | L | $L_{out}(=V_2)$ | L | L | $H_{out}(=V_2)$ | H | L | $L_{out}(=V_2)$ | H | L | $H_{out}(=V_2)$ |
| H | H | $L_{out}(=V_3)$ | H | H | $L_{out}(=V_3)$ | H | H | $H_{out}(=V_1)$ | H | H | $H_{out}(=V_1)$ |
| | NOR | | | NAND | | | AND | | | OR | |

(Second major column header: $M_3$ anti-parallel to $M_1$)

3. The logic device as defined in claim 2, wherein the fifth ferromagnetic layer has a direction magnetization altered by a direct bias voltage, and the alteration arises from a source of voltage in the absence of a magnetic field.

4. The logic device as defined in claim 3, wherein the third ferromagnetic layer is coupled to the sixth ferromagnetic layer.

5. The logic device as defined in claim 4, wherein the logic gate is capable of behaving as an AND, OR, NAND, or NOR depending upon the direction of magnetization of the second and fifth ferromagnetic layers and the external voltage.

6. The logic device as defined in claim 5, wherein the magnitude of the first and second input voltages determine the direction of magnetization of the second and fifth ferromagnetic layers.

7. The logic device as defined in claim 6, wherein the logic gate is capable of being reprogrammed to act as different types of logic gate depending upon the direction of magnetization of the second and fifth ferromagnetic layers and the external voltage.

8. The logic device as defined in claim 7, wherein the voltage-controlled rotation transistors are substantially identical to each other in relation to their compositions and the thicknesses of their individual components.

9. A reprogrammable logic gate, comprising:
first and second voltage-controlled rotation transistors, each transistor comprising first, second, and third ferromagnetic layers with a spacer and an insulator between the first and second ferromagnetic layers of each transistor and a second insulating layer between the second and third ferromagnetic layers of each transistor, wherein the second ferromagnetic layer of each transistor has a smaller thickness than the first ferromagnetic layer of the same transistor;
a connection between the third ferromagnetic layer of the first transistor and the third ferromagnetic layer of the second transistor; and
an external and constant voltage source between the second ferromagnetic layer of the first transistor and the ground, wherein the direction of magnetization of the second ferromagnetic layer of each transistor can be adjusted by altering the magnitude of the input voltages being applied to the first ferromagnetic layer of each transistor.

10. The logic gate of claim 9, wherein the output voltage of the logic gate can be altered depending upon the magnitude of an external voltage that is applied to the logic gate and the relative direction of magnetization of the third ferromagnetic layer of each transistor.

11. The logic gate of claim 10, wherein the logic gate is capable of being reprogrammed to behave as AND, OR, NAND, or NOR logic gates depending upon the voltages applied to the gate.

12. The logic gate of claim 11, wherein the two transistors are comprised of substantially identical types of materials.

13. The logic gate of claim 12, wherein each of the ferromagnetic layers in the first transistor have substantially the same thickness as its corresponding ferromagnetic layer in the second transistor.

14. The logic gate of claim 13, wherein the gate is capable of being reprogrammed in the absence of a magnetic field.

15. The logic gate of claim 14, wherein the gate is capable of being reprogrammed within about ten nanoseconds.

16. A voltage-controlled rotation transistor, comprising:
a voltage-controlled element, comprising:
a first electrode including a first ferromagnetic layer;
a second electrode comprising a second ferromagnetic layer disposed adjacent to the first ferromagnetic layer to form an interlayer exchange coupling;
an insulating layer located between the first and second electrodes; and
a spacer layer located between the first electrode and the second electrode; and
a tunneling magnetoresistance structure, comprising:
the second electrode of the voltage-controlled element including the second ferromagnetic layer;
a third electrode comprising a third ferromagnetic layer disposed adjacent to the second electrode; and
an insulating layer located between the second electrode and the third electrode.

17. The resistor of claim 16, further comprising an external voltage source applied to the third electrode.

18. The resistor of claim 17, further comprising an applied voltage that acts upon the first electrode.

19. The resistor of claim 18, wherein the second ferromagnetic layer has a smaller thickness than the first ferromagnetic layer, such that the direction of magnetization of the second ferromagnetic layer can be altered by adjusting the applied voltage.

20. The resistor of claim 19, wherein the resistance between the second and third ferromagnetic layers can be altered by adjusting the applied voltage.

* * * * *

UNITED STATES PATENT AND TRADEMARK OFFICE
CERTIFICATE OF CORRECTION

PATENT NO. : 6,249,453 B1
DATED : June 19, 2001
INVENTOR(S) : You et al.

Page 1 of 1

It is certified that error appears in the above-identified patent and that said Letters Patent is hereby corrected as shown below:

Column 1,
Line 47, "as" should be -- a --.

Column 3,
Second line of equation (1), "$\cos(\theta_1-\Phi_1)- HM_2d_2\cos(\theta_2-\Phi)$" should be
-- $\cos(\theta_1-\Phi)- HM_2d_2\cos(\theta_2-\Phi)$ --.

Column 4,
Line 37,    "$\Delta R_o=R\uparrow\eta-R\uparrow\uparrow=R\downarrow-R_o$"

should be    -- $\Delta R_o=R\uparrow\downarrow-R\uparrow\uparrow=R\downarrow\downarrow-R_o$ --.

Line 48, "    $\Delta V_{out}=V_{out}^H-V_{out}^L \approx V_{ext}R_L\Delta R_o/(R_L+R_o)^2$"

should be    -- $\Delta V_{out}=V^H_{out}-V^L_{out} \approx V_{ext}R_L\Delta R_o/(R_L+R_o)^2$ --.

Line 66, "$V^{inA}$" should be -- $V_{in}^A$ --.

Column 5,
Line 35, "$V_{c2}$" should be -- $V_{c1}$ --.
Table 1, third line of text "stge" should be -- stage --.
Table 1, in the column that ends with "NAND", under $V_{in}^A$, third letter down,
"L" should be -- H --.

Signed and Sealed this

Nineteenth Day of March, 2002

Attest:

JAMES E. ROGAN
Director of the United States Patent and Trademark Office

*Attesting Officer*